(12) United States Patent
Blank et al.

(10) Patent No.: US 11,876,041 B2
(45) Date of Patent: *Jan. 16, 2024

(54) SEMICONDUCTOR DEVICE HAVING A METALLIZATION STRUCTURE

(71) Applicant: Infineon Technologies Austria AG, Villach (AT)

(72) Inventors: Oliver Blank, Villach (AT); Gerhard Noebauer, Villach (AT)

(73) Assignee: Infineon Technologies Austria AG, Villach (AT)

( * ) Notice: Subject to any disclaimer, the term of this patent is extended or adjusted under 35 U.S.C. 154(b) by 143 days.

This patent is subject to a terminal disclaimer.

(21) Appl. No.: 17/556,247

(22) Filed: Dec. 20, 2021

(65) Prior Publication Data

US 2022/0115314 A1 Apr. 14, 2022

Related U.S. Application Data

(63) Continuation of application No. 16/919,389, filed on Jul. 2, 2020, now Pat. No. 11,239,147.

(30) Foreign Application Priority Data

Jul. 4, 2019 (EP) ..................................... 19184547

(51) Int. Cl.
*H01L 23/498* (2006.01)
*H01L 29/417* (2006.01)
(Continued)

(52) U.S. Cl.
CPC .. *H01L 23/49844* (2013.01); *H01L 23/49513* (2013.01); *H01L 23/49562* (2013.01);
(Continued)

(58) Field of Classification Search
CPC ......... H01L 23/49844; H01L 23/49562; H01L 23/49838; H01L 23/5283; H01L 2224/02373; H01L 29/41741; H01L 29/7827; H01L 21/823487; H01L 27/0826–0828; H01L 21/823885
See application file for complete search history.

(56) References Cited

U.S. PATENT DOCUMENTS 5,807,783 A 9/1998 Gaul et al.
10,559,594 B2 2/2020 Tarakji et al.
(Continued)

*Primary Examiner* — Amar Movva
(74) *Attorney, Agent, or Firm* — Murphy, Bilak & Homiller, PLLC

(57) ABSTRACT

In some embodiments, a semiconductor device includes a semiconductor die including a vertical transistor device having a source electrode, a drain electrode and a gate electrode, the semiconductor die having a first surface and a metallization structure. The metallization structure includes a first conductive layer above the first surface, a first insulating layer above the first conductive layer, a second conductive layer above the first insulating layer, a second insulating layer above the second conductive layer and a third conductive layer above the second insulting layer. The third conductive layer includes at least one source pad electrically coupled to the source electrode, at least one drain pad electrically coupled to the drain electrode and at least one gate pad electrically coupled to the gate electrode.

20 Claims, 10 Drawing Sheets

(51) Int. Cl.
    *H01L 29/43*     (2006.01)
    *H01L 23/495*     (2006.01)
    *H01L 23/00*     (2006.01)

(52) U.S. Cl.
CPC .............. *H01L 24/02* (2013.01); *H01L 24/05* (2013.01); *H01L 24/06* (2013.01); *H01L 29/41741* (2013.01); *H01L 29/435* (2013.01); *H01L 23/4952* (2013.01); *H01L 23/49524* (2013.01); *H01L 24/29* (2013.01); *H01L 24/32* (2013.01); *H01L 24/40* (2013.01); *H01L 24/48* (2013.01); *H01L 24/73* (2013.01); *H01L 2224/0239* (2013.01); *H01L 2224/02373* (2013.01); *H01L 2224/02375* (2013.01); *H01L 2224/05082* (2013.01); *H01L 2224/05083* (2013.01); *H01L 2224/05147* (2013.01); *H01L 2224/05155* (2013.01); *H01L 2224/05166* (2013.01); *H01L 2224/05172* (2013.01); *H01L 2224/05186* (2013.01); *H01L 2224/05639* (2013.01); *H01L 2224/05647* (2013.01); *H01L 2224/05686* (2013.01); *H01L 2224/0603* (2013.01); *H01L 2224/06182* (2013.01); *H01L 2224/2919* (2013.01); *H01L 2224/29116* (2013.01); *H01L 2224/32245* (2013.01); *H01L 2224/40245* (2013.01); *H01L 2224/48245* (2013.01); *H01L 2224/73221* (2013.01); *H01L 2224/73263* (2013.01); *H01L 2224/73265* (2013.01); *H01L 2924/05042* (2013.01); *H01L 2924/0544* (2013.01); *H01L 2924/13091* (2013.01)

(56) References Cited

U.S. PATENT DOCUMENTS

| | | | |
|---|---|---|---|
| 11,239,147 B2* | 2/2022 | Blank | ............... H01L 23/49844 |
| 2012/0049373 A1 | 3/2012 | Gietler et al. | |
| 2012/0267711 A1 | 10/2012 | Grebs et al. | |
| 2013/0277735 A1 | 10/2013 | Kinzer et al. | |
| 2019/0287948 A1 | 9/2019 | Domori | |

* cited by examiner

SEMICONDUCTOR DEVICE HAVING A METALLIZATION STRUCTURE

BACKGROUND

Common transistor devices for power applications include Si CoolMOS®, Si Power MOSFETs, and Si Insulated Gate Bipolar Transistors (IGBTs). A semiconductor device, such as a transistor device is commonly provided in a package. The package may include a substrate or a leadframe which provides outer contacts which are used to mount the electronic component onto a redistribution board such as a printed circuit board. The package also includes internal electrical connections from the transistor device to the substrate or leadframe and a plastic molding compound which covers the semiconductor device and the internal electrical connections.

In order to achieve a low drain to source resistance, $R_{DS(on)}$, while the transistor is on, vertical transistor devices include a drain electrode and a source electrode on opposing surfaces. However, by placing the drain and the drain contact on a surface which is opposite to the surface on which the source contact is placed, electrical connections must be supplied to both sides of the device. Vertical transistor devices are consequently more challenging to package using wafer level chip scale packaging techniques.

US 2013/0277735 A1 discloses an example of wafer level chip size package including a vertical transistor which has a source contact, drain contact and gate contact arranged on a common side. A through silicon via is used to electrically couple the drain region to the drain contact positioned on the opposing surface.

However, further improvements would be desirable to allow chip sized packages for vertical transistor devices with an even lower $R_{DSon}$.

SUMMARY

In some embodiments, a semiconductor device comprises a semiconductor die comprising a vertical transistor device having a source electrode, a drain electrode and a gate electrode, the semiconductor die having a first surface and a metallization structure located on the first surface. The metallization structure comprises a first conductive layer on the first surface, a first insulating layer on the first conductive layer, a second conductive layer on the first insulating layer, a second insulating layer on the second conductive layer and a third conductive layer on the second insulting layer. The third conductive layer comprises at least one source pad coupled to the source electrode, at least one drain pad coupled to the drain electrode and at least one gate pad coupled to the gate electrode.

The semiconductor device includes pads which are suitable for electrically coupling the transistor device to a circuit board and/or external circuit and/or external load, so that the semiconductor device can be described as a package. As the pads are positioned on a major surface of the semiconductor die, the semiconductor device can be described as a chip sized or chip scale package.

In some embodiments, the metallization structure includes more than three conductive layers and an insulation layer is arranged between each of the conductive layers.

In some embodiments, more than one device is provided within the semiconductor die so that a more complex circuit can be provided, e.g. a half bridge circuit. In some embodiments, more than one transistor device is provided within the semiconductor die so that a more complex circuit can be provided, e.g. a half bridge circuit. In these embodiments, the semiconductor device may also be called a module.

The source electrode and the drain electrode provide the power electrodes of the transistor device and may be more generically denoted as a first and a second power electrode. In some embodiments, the source electrode and the source pad may be denoted as the first power electrode and the first power pad, respectively, and the drain electrode and drain pad are denoted as the second power electrode and the second power pad, respectively.

In some embodiments, the first conductive layer comprises a first source redistribution structure coupled to the source electrode, a first drain redistribution structure coupled to the drain electrode and a first gate redistribution structure coupled to the gate electrode. The first source redistribution structure comprises a plurality of discrete first conductive regions. The first drain redistribution structure comprises a plurality of discrete second conductive regions that are laterally positioned between and laterally spaced apart from the first discrete conductive regions of the first source redistribution structure.

In some embodiments, the plurality of discrete second conductive regions of the first drain redistribution structure are electrically coupled together by the second conductive layer and the plurality of discrete first conductive regions of the first source redistribution structure are electrically coupled together by the third redistribution structure.

Alternatively, the plurality of discrete second conductive regions of the first drain redistribution structure are electrically coupled together by the third conductive layer and the plurality of discrete first conductive regions of the first source redistribution structure are electrically coupled together by the second redistribution structure.

More broadly, the discrete conductive regions that are coupled to a first power electrode are laterally electrically coupled to one another in a conductive layer of the metallization structure that is different from the conductive layer of the metallization structure that electrically couples the discrete conductive portions that are coupled to a second power electrode. As an insulating layer is arranged between each of the conductive layers, this arrangement enables the lateral connection between the discrete conductive regions coupled to a first power electrode to be positioned vertically above the lateral connection between the discrete conductive regions coupled to the second power electrode, thus allowing the area occupied by the redistribution structure between the electrodes of the transistor device and the outer contacts provided by the pads to be reduced. In some embodiments, the redistribution structure between the electrodes of the transistor device and the outer contacts provided by the pads is provided entirely within the area of the semiconductor die in which the transistor device is formed.

In some embodiments, the discrete second conductive regions of the first drain redistribution structure are elongated and have a strip form.

In some embodiments, the discrete first conductive regions of the first source redistribution structure are elongated and have a strip form.

In some embodiments, the semiconductor device further comprises one or more conductive vias extending into the semiconductor die from the first surface. The one or more conductive vias are electrically coupled to a doped drain region positioned within the semiconductor die and to the first drain redistribution structure on the first surface of the semiconductor die.

In some embodiments, the vertical transistor device comprises an active area that is divided into a plurality of cell fields. At least one conductive via that is coupled to the drain electrode is positioned between adjacent cell fields. The conductive via may have an elongate strip form.

The vertical transistor device may comprise two elongate conductive vias that extend substantially parallel to one another and are positioned between adjacent cell fields. The two elongate conductive vias are coupled to the drain electrode at differing lateral positions. The two elongate conductive vias are electrically coupled to a common one of the second discrete conductive regions of the first drain distribution structure.

In some embodiments, the first insulating layer is arranged on and laterally between the first source redistribution structure and the first drain redistribution structure. In some embodiments, the first insulating layer comprises first openings exposing defined portions of the first discrete conductive regions of the first source redistribution structure and second openings exposing defined portions of the second discrete conductive regions of the first drain redistribution structure.

A plurality of first openings may be positioned on a single first discrete conductive region and a single second opening may be provided for each second discrete conductive region.

In some embodiments, the second conductive layer comprises a second source redistribution structure that is electrically coupled to the first source redistribution structure and a second drain redistribution structure that is electrically coupled to the first drain redistribution structure. The second source redistribution structure is arranged in the first openings of the first insulation layer and comprises a plurality of first conductive islands that are arranged on the first conductive regions of the first source redistribution structure. The second drain redistribution structure is arranged in the second openings of the first insulation layer and is also laterally positioned between and laterally spaced apart from the first conductive islands of the second source redistribution structure. The second drain redistribution structure may laterally surround the first conductive islands of the second source redistribution structure.

In some embodiments, the second drain redistribution structure electrically couples the second conductive regions of the first drain redistribution structure to one another.

In some embodiments, the second drain redistribution structure is arranged vertically above the first drain redistribution structure and vertically above portions of the first source redistribution structure that are covered by the first insulation layer.

In some embodiments, the second insulating layer is arranged on the second source redistribution structure and on the second drain redistribution structure and has third openings exposing defined regions of the first conductive islands of the second source redistribution structure and at least one fourth opening exposing a defined region of the second drain redistribution structure. A single third opening may be positioned on each first conductive island.

In some embodiments, the third conductive layer comprises a third source redistribution structure that is electrically coupled to the second source redistribution structure and a third drain redistribution structure that is electrically coupled to the second drain redistribution structure. In some embodiments, the third source redistribution structure is arranged in the third openings and electrically couples the first conductive islands of the second source redistribution structure to one another. The third drain redistribution structure extends over portions of the second drain redistribution structure that are covered by the second insulation layer. The third drain redistribution structure is arranged in the fourth opening and comprises a second conductive island that is laterally spaced apart from the third source redistribution structure.

In some embodiments, a plurality of fourth openings are provided in the second insulating layer, each exposing a defined region of the second drain redistribution structure. In some embodiments, the third drain redistribution structure comprises a plurality of second conductive islands that are laterally spaced apart from one another and from the third source redistribution structure.

In some embodiments, the second conductive islands of the third drain redistribution structure each have a lateral size that is greater than the lateral size of the fourth opening such that each extends over portions of the second source redistribution structure that are covered by the second insulation layer.

In some embodiments, the conductive vias, the first drain redistribution structure, the first source redistribution structure and the first gate redistribution structure comprise tungsten, the first insulating layer comprises a polyimide, the second drain redistribution structure, the second source redistribution structure is formed of an AlCu alloy, the second insulating layer comprises a polyimide and the third drain redistribution structure and the third source redistribution structure is formed of Cu.

Tungsten is useful in that it can be used to fill vias in the semiconductor device in a vertical direction to form the conductive vias and can be deposited on lateral surfaces, such as the first surface, to provide the first source, first drain and first gate redistribution structures. An aluminium copper alloy is useful as it has a lower resistance. Cu is useful in that it forms a solderable surface for the pads provided by the third conductive layer.

The outer surface of the third conductive layer may have a solderable outer surface. In some embodiments, the source pad, drain pad and gate pad have a solderable outer surface. The solderable outer surface may be provided by the material of the third conductive layer or may be provided by an additional layer arranged on the third conductive layer.

In some embodiments, the semiconductor device further comprises an epoxy layer arranged on the third conductive layer. In some embodiments, the epoxy layer comprises at least one fifth opening that exposes a portion of the third source redistribution layer and defines the source pad, at least one sixth opening that exposes a portion of the second conductive island of the third drain redistribution structure and defines the drain pad, and at least one seventh opening that defines the gate pad.

In some embodiments, the semiconductor device further comprises solder on the source pad, the drain pad and the gate pad.

In some embodiments, the semiconductor die comprises a second side opposing the first side, the second side being electrically inactive and/or comprising a third insulating layer or being bare.

In some embodiments, the semiconductor die comprises a second side opposing the first side, the second side being electrically coupled to drain and/or comprising a second metallization layer.

In some embodiments, the semiconductor device further comprises side faces extending between the first and second surface, wherein the side faces are bare, or a passivation layer or an insulating layer is arranged on the side faces.

In some embodiments, the vertical transistor device comprises an active area and the area of the first surface of the semiconductor die is less than 130% or less than 120% of the active area of the transistor device. The active area may be defined as the area of the source implantation region in the semiconductor die. The area of the first surface of the semiconductor die is defined by the side faces of the semiconductor die without any additional packaging.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

DETAILED DESCRIPTION

Figure 1:
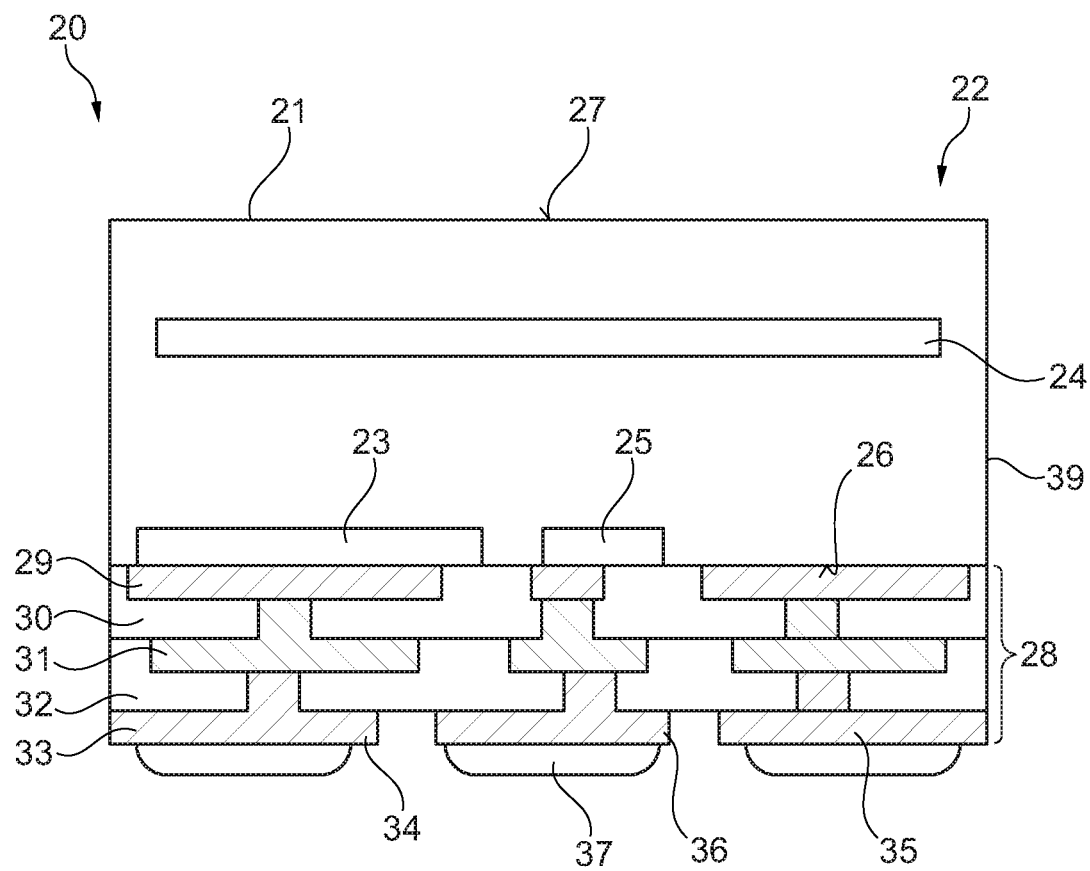
FIG. 1 illustrates a schematic cross-sectional view of a semiconductor device including a transistor device and a metallization structure according to an embodiment.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor body. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor body.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In vertical transistor devices, such as Power MOSFETs, the current typically flows from a top side of the chip (source) to the back side of the chip (drain) or the chip is flipped and the current flows the other way around. In the final footprint of the package all, 3 pins (source, gate, drain) are located at only one side. In order to allow all pins to be positioned on a single side, the chip is placed into a package, such as a S3O8, SSO8, TO220 or DirectFET package. In these packages, the re-wiring from the two opposite sides of the transistor device to the substrate and leadframe of the package and the encapsulation consumes space. Typically, the footprint of the package has double the size than the maximum chip size that can be placed in the package.

Embodiments described herein provide a chip scale package for a vertical transistor device, such as a power MOSFET, which does not require a separate packaging process. The chip scale package described herein does not use a metal can and has no die attach to a metal can or a die pad. Three or more metallization layers are used to realize the re-wiring directly on the chip. All the outer contacts, for example contact pads, metal bumps, solder bumps or solder balls, are placed on the front side of the chip and are the interface to the customer's board. The outer contacts, e.g. contact pads, metal bumps, solder bumps or solder balls, of Source, Gate and Drain may be processed at the wafer level.

This arrangement enables the footprint of the device and chip size to be nearly the same, no separate packaging process is needed, a package cost reduction is achieved as the Si area for re-wiring is very small and the Si area cost are below standard packaging costs. Additionally, the risk of die attach degradation is avoided, the chip thickness can be chosen according to customer or reliability needs, the package+Si substrate resistance is low, and the footprint and contact layout can be adapted easily by a layout change to the metallization structure.

In some embodiments, backside thinning technology and/or backside metallization is avoided as the drain electrode is positioned within the semiconductor die in the final product rather than forming the rear surface of the semiconductor die.

FIG. 1 illustrates a schematic cross-sectional view of a semiconductor device 20 according to an embodiment. The semiconductor device 20 includes a semiconductor die 21 which comprises a vertical transistor device 22. The vertical transistor device 22 may be a MOSFET or an IGBT, for example. The vertical transistor device 22 has a source electrode 23, a drain electrode 24 and a gate electrode 25 which are each indicated in FIG. 1 purely schematically as a block in order to illustrate each of the source electrode 23, drain electrode 24 and gate electrode 25 as a functional element. The drift path between the source electrode 23 and the drain electrode 24 is vertical and substantially perpendicular to a first major surface 26 of the semiconductor die 21. The drain electrode 24 may be provided by a doped drain region which is positioned vertically above the source electrode 23. The drain region may be positioned at a second major surface 27 of the semiconductor die 21 which opposes the first major surface 26 or may be positioned within the semiconductor die 21 and spaced apart from the second major surface 27 as shown in FIG. 1.

The semiconductor device 20 further includes a metallization structure 28 which is located on the first surface 26 of the semiconductor die 21. The metallization structure 28 includes a first conductive layer 29 positioned on the first surface 26, a first insulating layer 30 positioned on the first conductive layer 29, a second conductive layer 31 positioned on the first insulating layer 30, a second insulating layer 32 positioned on the second conductive layer 31 and a third conductive layer 33 positioned on the second insulating layer 32 in this order. The third conductive layer 33 comprises at least one source pad 34 which is electrically coupled to the source electrode 23, at least one drain pad 35 which is electrically coupled to the drain electrode 24 and at least one gate pad 36 which is electrically coupled to the gate electrode 25.

The source pad 34, drain pad 35 and gate pad 36 are arranged on the first surface 26 of the semiconductor die 21 and, therefore, on a common side of the semiconductor device 20. The semiconductor device 20 can be referred to as a package since the source pad 34, gate pad 36 and drain pad 35 are able to serve as the outer contacts for the transistor device 22. The semiconductor device 20 may be called a chip sized package or a chip scale package since its overall area is not that much larger than the semiconductor die 21.

The vertical transistor device 22 includes an active area that describes the area of the transistor device 22 that contributes to the power switching function of the transistor device 22. In some embodiments, the area of the first surface 26 of the semiconductor die 120 is less than 130% or even less than 120% of the active area of the transistor device 22 or at most 110% of the active area of the transistor device. The active area of the transistor device 22 is defined as the area of the source implantation region. The area of the first surface 26 of the semiconductor die 120 is defined by the side faces of the semiconductor die 120.

In embodiments in which the source pad 34, drain pad 35 and gate pad 36 provide the outer contacts of the semiconductor device 20, the outermost surface of these pads may include a solderable material allowing solder to wet and adhere to the respective pad. In some embodiments, solder 37 is positioned on each of the source pad 34, the drain pad 35 and the gate pad 36. In other embodiments, a contact bump, which may include a metal other than a solder, or a solder ball, may be positioned on each of the pads 34, 35, 36. A further solder layer may be positioned on the metallic bumps.

The lateral area of the footprint of the semiconductor device 20 and lateral area of die semiconductor die 21 are nearly the same since the metallization structure 28 providing the outer contacts of the semiconductor device 20 is positioned on the first surface 26 of the semiconductor die 21. Consequently, the use of a separate packaging process is avoided. The arrangement of the contact pads 34, 35, 36 can be adapted to a particular application by modifying the patterning of the layers of the metallization structure 28, for example the openings in the second insulating layer 32 and the third conductive layer 33.

The third conductive layer 33, which provides the source pad 34, drain pad 35 and gate pad 36, may be formed of copper, the second conductive layer may be formed of an aluminium copper alloy and the first conductive layer 29 may be formed of tungsten. In some embodiments, the first conductive layer further comprises an additional layer or layers, for example, a Ti and TiN sublayers, on which the tungsten layer is deposited in order to increase the adhesion and electrical contact to the semiconductor material. In some embodiments, both the first insulating layer 30 and the second insulating layer 32 are formed of polyimide.

In some embodiments, the second side 27 of the semiconductor die 21 is electrically inactive and is not used for electrical connection. In these embodiments, the second surface of the semiconductor die 21 is not formed by a doped semiconductor region forming the drain electrode 24. In some embodiments, the second side 27 of the semiconductor die 21 may be a doped substrate or layer stack that was formed at the wafer level, but that is not used for electrical connection. In some embodiments, the second side 27 comprises a further metallic layer or layers positioned on the semiconductor die 21. A third insulating layer may be positioned on the second major surface 27 of the semiconductor die 21. The third insulating layer may be an epoxy layer or an epoxy foil. In some embodiments, the second major surface 27 may be bare and be formed of the material of the semiconductor die 21, e.g. silicon.

In some non-illustrated embodiments, a second metallization layer is positioned on the second major surface 27 that is electrically floating and, for example, form a convenient surface for attaching a heatsink.

In other embodiments, the second surface 27 of the semiconductor device 20 may be electrically coupled to the drain 24 and be formed of the doped drain region. In some embodiments, a second metallization structure is positioned on the second major surface 27 of the semiconductor die 21 and is coupled to the drain electrode 24.

The semiconductor die 21 further includes side faces 39 which extend between the first major surface 26 and second major surface 27 of the semiconductor die 21. The side faces 39 may be bare and be formed of the semiconductor material of the semiconductor die 21 or one or more passivation layers or insulating layers may be arranged on the side faces 39.

The metallization structure 28 forms a conductive redistribution structure between the source electrode 23 and the source pad 34, the drain electrode 24 and the drain pad 35 and the gate electrode 25 and gate pad 36. The metallization structure 28 includes a minimum of three conductive layers which are vertically interleaved by one or more insulating layers. In some embodiments, the metallization structure 28 includes only the three conductive layers 29, 31, 33 and two insulating layers 30, 32. In other embodiments, the metallization structure 28 may further include additional conductive layers and insulating layers. The lowest conductive layer that is in contact with the semiconductor die 20 may comprise tungsten and the outermost conductive layer that provides the pads may be formed of copper. Some or all of the insulating layers may comprise polyimide.

Figure 9:
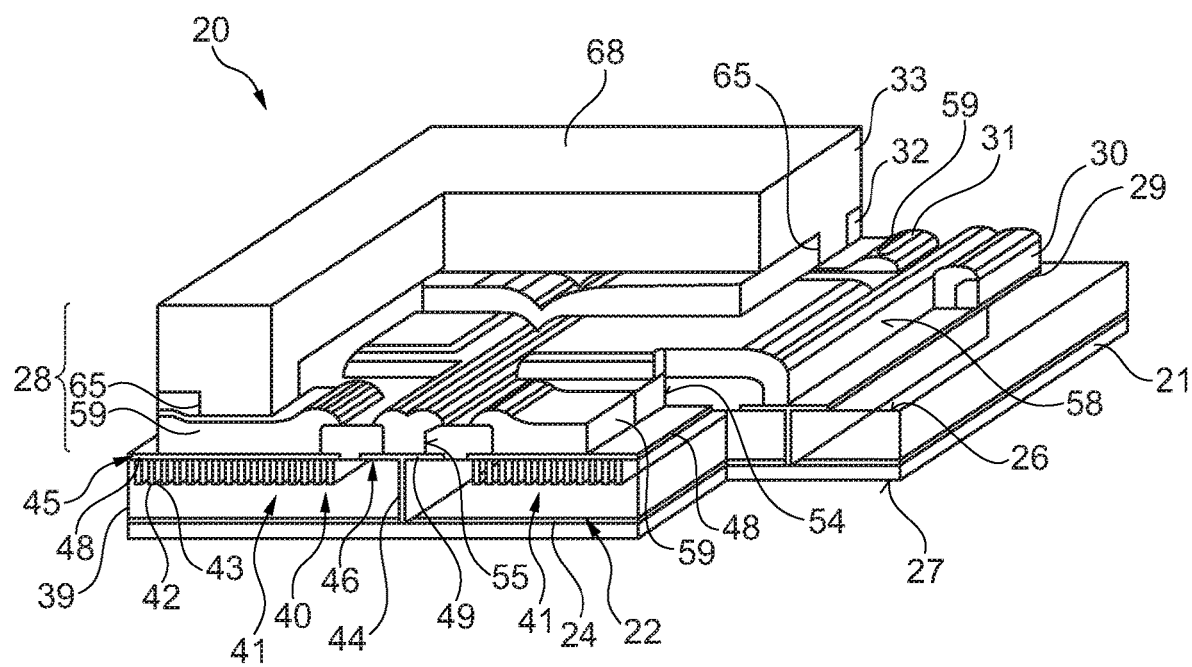
FIG. 9 illustrates a partially cutaway perspective view of the semiconductor device illustrating the transistor cells of the transistor device and the metallization structure.

FIG. 9 shows a cross-sectional perspective view of the semiconductor device 20 including the metallization structure 28 and also illustrates the transistor device 22 in more detail.

The vertical transistor device 22 may have a design such that its active area 40 is divided into a plurality of cell fields 41. Referring to the perspective view of FIG. 9, each of the cell fields 41 may include a plurality of trenches 42 separated by mesas 43. The trenches 42 extend from the first major surface 26 into the body of the semiconductor die 21. Each of the trenches 42 may include a field plate. The trenches 42 may be elongated and extend substantially parallel to one another. Each cell of the cell field includes a trench 42 and mesa 43. In each cell, mesa 43 comprises the source electrode 23, that is formed by a doped source region, positioned on a body region doped with the opposing conductive type. In some embodiments, a gate electrode 40 is positioned within each of the trenches 42 and positioned on and electrically insulated from the field plate 42. In other embodiments, the gate electrode is positioned in a gate trench that is positioned in the mesa 43 and extends through and is electrically insulated from the source region and body region. The transistor device 22 further includes the doped drain region forming the drain electrode 24 which is spaced apart from the bottom of the trenches 42 and which may be continuous over the entire active area 40. A vertical electrical connection between the drain electrode 24 and the first major surface 26 is formed by at least one conductive via 44 which is positioned in the semiconductor die. The conductive vias 44 extend into the first major surface 26 to the doped drain region 24. The conductive vias 44 are laterally arranged between adjacent cell fields 41. In some embodiments, two conductive vias 44 are positioned between adjacent cell fields 41.

Figure 2:
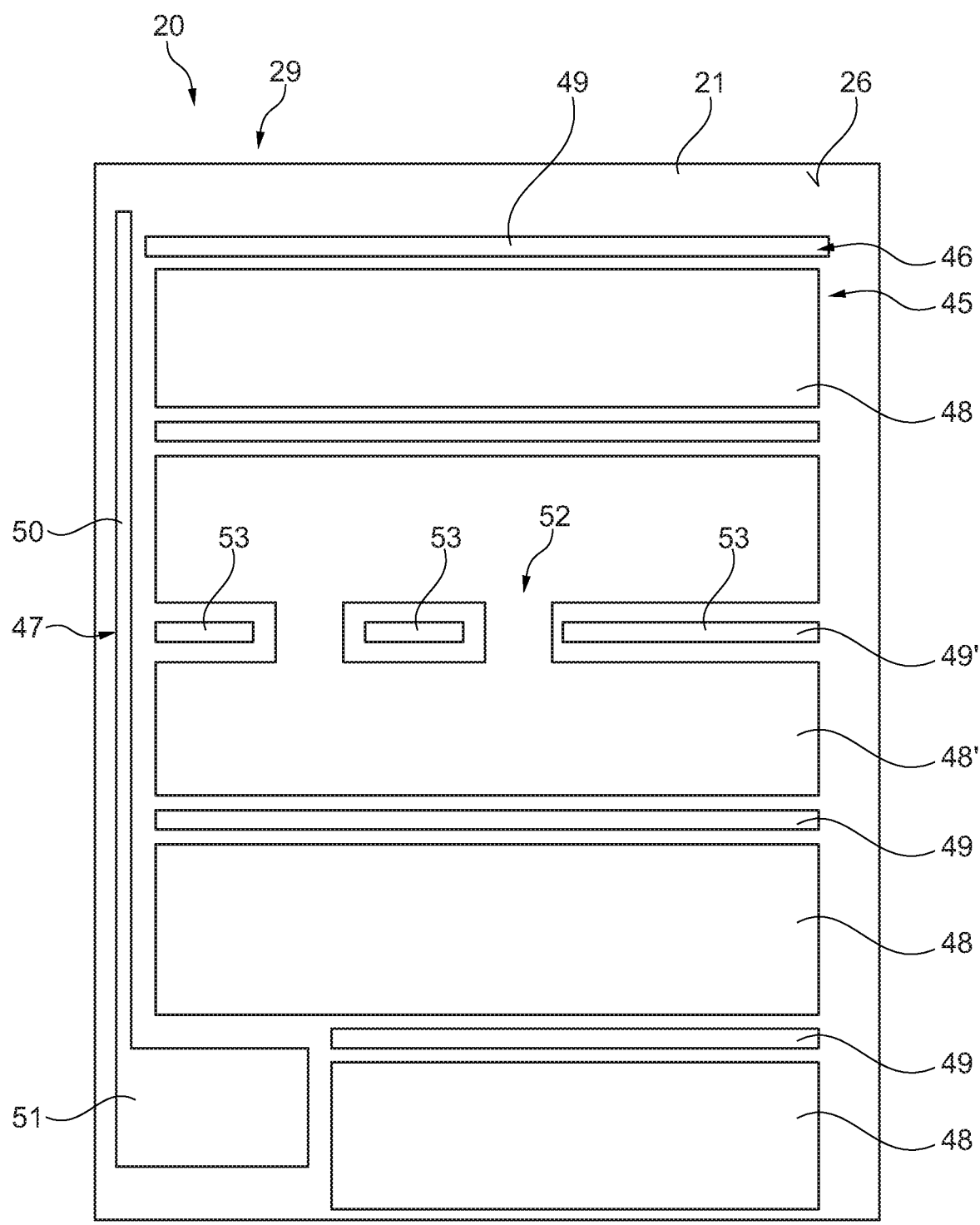
FIG. 2 illustrates a schematic plan view of a first conductive layer of the metallization structure.

Referring additionally to FIG. 2, FIG. 2 illustrates a schematic plan view of a portion of the first conductive layer 29 positioned on the first major surface 26 of the semiconductor die 21. The first conductive layer 29 comprises a first source redistribution structure 45, which is electrically coupled to the source electrode 23, a first drain redistribution structure 46, which is electrically coupled to the drain electrode 24, and a first gate redistribution structure 47 which is electrically coupled to the gate electrode 25. The first source redistribution structure 45, the first drain redistribution structure 46 and the first gate redistribution structure 47 are substantially coplanar and laterally spaced apart from one another and electrically insulated from one another so that each of the three redistribution structures of the first conductive layer 29 can be electrically connected to a different potential.

The first source redistribution structure 45 includes a plurality of discrete first conductive regions 48 which are positioned on the trenches 42 of the cell fields 41. One first conductive region 48 may be provided for each cell field 41. The first discrete conductive regions 48 are laterally spaced apart from one another and may have the form of strips which extend substantially parallel to one another. The first drain redistribution structure 46 comprises a plurality of second discrete conductive regions 49 each of which is positioned between two adjacent first discrete conductive regions 48. Each of the second discrete conductive regions 49 is positioned on and electrically coupled to one or more conductive vias 44 which are in turn electrically coupled to the drain electrode 24. Each of the second discrete conductive regions 49 is laterally spaced apart from the first conductive regions 48. Each of the second conductive regions 49 may have an elongate stripe-like structure and extend substantially parallel to the first discrete conductive regions 48.

As seen in the plan view of FIG. 2, the first gate redistribution structure 47 may be positioned towards a peripheral edge of the first major surface 26 and includes a gate runner 50 which extends substantially perpendicularly to the first and second discrete conductive regions 48, 49 and into a larger area gate pad portion 51. In some embodiments, the gate pad 51 is positioned at the corner of the first major surface 26.

In some embodiments, at least some of the second discrete conductive regions 49' are interrupted and include two or more laterally separate sections 53 that are spaced apart by a gap 52 positioned between two adjacent sections 53. The first discrete conductive region 48' extends through the gap 52 and is positioned adjacent two opposing laterally sides of the sections 53.

Referring to the partial cross-sectional view of FIG. 9, the second discrete conductive regions 49 may be formed as the conductive material forming the conductive vias 44. In some embodiments, the first discrete conductive regions 48 of the first source redistribution structure 45, the second discrete conductive regions 49 of the first drain redistribution structure 46, the first gate redistribution structure 47 and the conductive vias 44 are formed of tungsten. This same material may be formed in the same deposition step.

The first drain redistribution structure 46 and the first source redistribution structure 45 each include a plurality of discrete conductive regions which are laterally separate. In order to electrically couple the source electrode in each of the cell fields 41 with one another and with the source pad 34, the plurality of first discrete conductive regions 48 are electrically coupled to one another by means of one of the overlying conductive layers of the metallization structure 28. Similarly, in order to couple the conductive vias 44 and the second discrete conductive regions 49 of the first drain redistribution structure 46 to one another and also to the drain pad 24, the conductive vias 44 and the second discrete conductive regions 49 of the first drain redistribution structure 46 are electrically coupled to one another by one of the overlying conductive layers of the metallization structure 28.

In some embodiments, the electrical connection between the first discrete conductive regions 48 coupled to the source electrode 23 and the electrical connection between the second discrete conductive regions 49 coupled to the drain electrode 24 are formed in different conductive layers of the metallization structure 28.

For example, in some embodiments, the second discrete conductive regions 49 are electrically coupled to one another by the second conductive layer 31 and the first discrete conductive regions 48 are electrically coupled to one another by the third conductive layer 33. Alternatively, the second discrete conductive regions 49 are electrically coupled to one another by means of the third conductive layer 33 and the first discrete conductive regions 48 are electrically coupled to one another by the second conductive layer 31.

By providing the lateral connection for the two power electrodes, that is the source electrode and the drain electrode, in different conductive layers of the metallization structure 28, a larger area electrical connection can be formed between the discrete conductive regions within the respective layer. Additionally, the electrical connection between the particular electrode types, for example, the source electrodes in the different cell fields 41, can be positioned vertically above the electrical connection between the other one of the electrodes, for example the drain electrode and conductive vias coupled to the drain electrode. Consequently, a low resistance redistribution structure between the source electrode 23 and the source pad 34 and between the drain electrode 24 and the drain pad 35 can be formed within a smaller lateral area. This allows in turn the overall area of the semiconductor device 20 to be kept smaller and as similar as possible to the active area 40 of the transistor device 22 that is required to provide the desired on resistance of the device. Additional area, which is simply used for the metallization structure and electrical redistribution structure, is not required. Therefore, the area and footprint of the semiconductor device 20 can be kept small.

Figure 3:
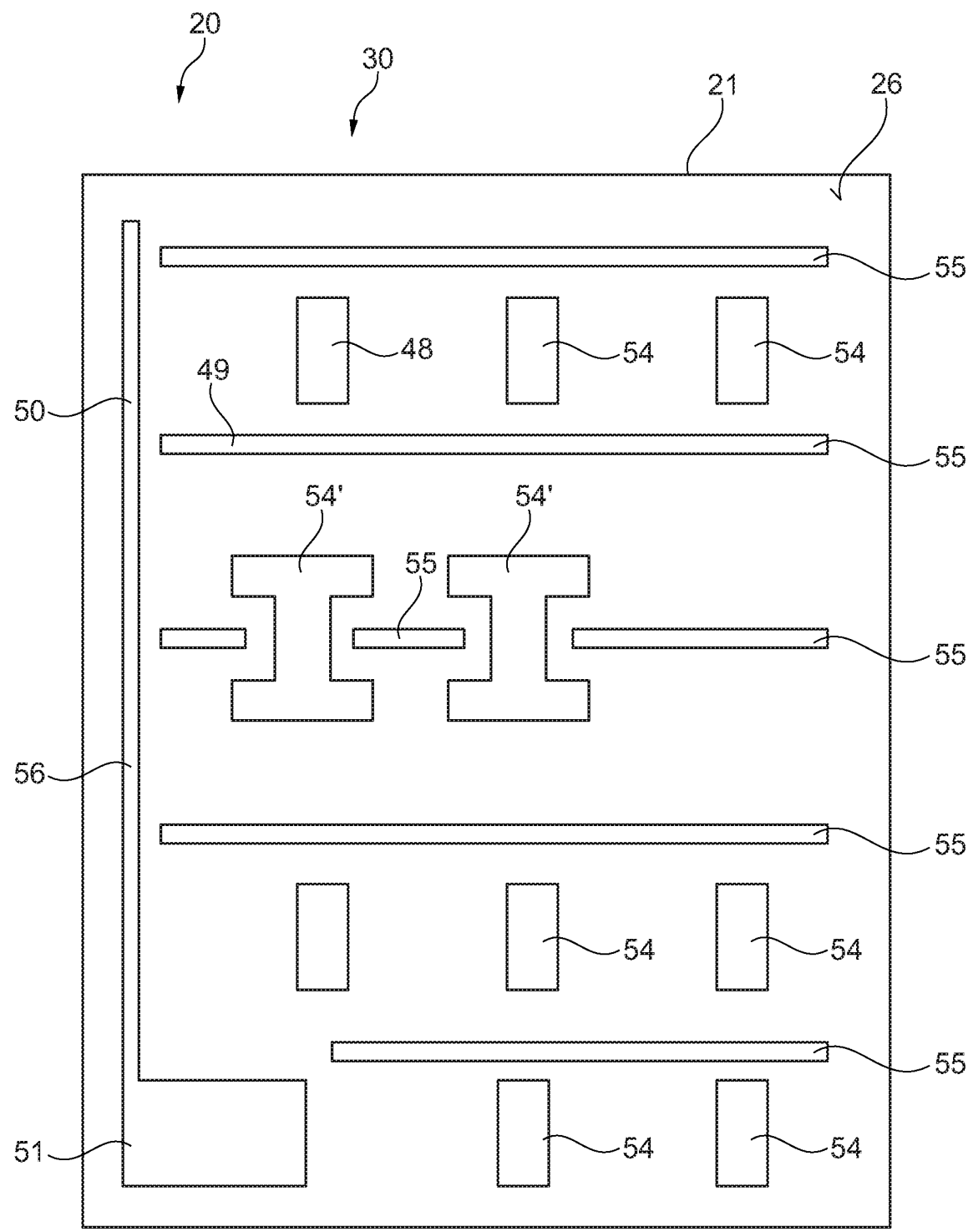
FIG. 3 illustrates a schematic plan view of a first insulating layer of the metallization structure positioned on the first conductive layer of FIG. 2.

FIG. 3 illustrates a schematic plan view of a first insulating layer 30 of the metallization structure 28 for the transistor first conductive layer 29 of FIG. 2. The first insulating layer 30 is positioned laterally between the first source redistribution structure 45 and the first drain redistribution structure 46 and, consequently, between the first discrete conductive regions 48 and second discrete conductive regions 49. The first insulation layer 30 is also positioned on and at least partially covers the first and second discrete conductive regions 48, 49. The first insulating layer 30 also extends on the gate redistribution structure 47 and between the gate redistribution structure 47 and the first and second discrete conductive regions 48, 49.

The first insulating layer 30 includes first openings 54 which are positioned on the first discrete conductive regions 48 of the first source redistribution structure 45 such that a defined portion of the first conductive regions 48 of the first redistribution structure 45 is exposed at the base of the opening 54. The first insulating layer 30 further includes second openings 55 which exposed defined portions of the second discrete conductive regions 49 of the first drain redistribution structure 46.

The first openings 54 may be substantially laterally smaller than the lateral extent of the first discrete conductive region 48 such that two or more first openings 54 are positioned laterally adjacent one another and spaced apart from one another on a single discrete conductive region 48. Each of the second openings 55 may have a lateral form which substantially corresponds to the strip-like second conductive region 49 and may expose a predefined region which is only slightly smaller than the lateral extent of the underlying second discrete conductive region 49. The first insulating layer 30 further includes a first opening 54' that is positioned laterally between the sections 53 of the interrupted second discrete conductive region 49'. The first opening 54' is larger than the other first openings 54. In some embodiments, the first opening 54' may have a H or I shape such that the longitudinal portions extend substantially perpendicular to the strip-like second openings 55 and the transverse portion extends substantially parallel to the strip-like second opening 55. The first insulating layer 30 includes a further opening 56 which is positioned on and exposes a predefined portion of the gate redistribution structure 47 and may expose at least a portion of the gate runner 50 in addition to a portion of gate pad portion 51. The lateral form of further opening 56 may substantially correspond to the lateral form of the underlying first gate redistribution structure 47.

Figure 4:
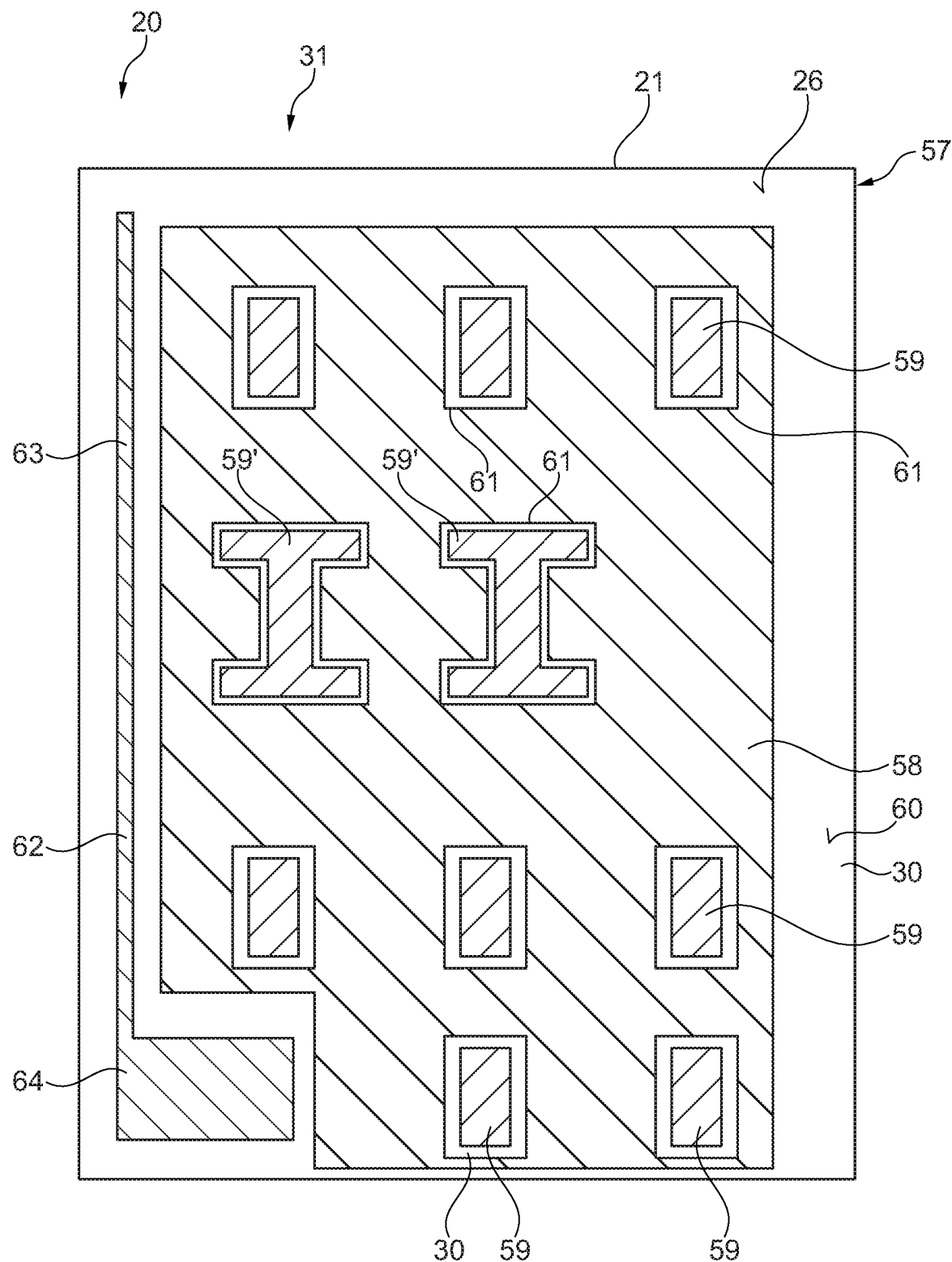
FIG. 4 illustrates a schematic plan view of a second conductive layer of the metallization structure positioned on the first insulating layer of FIG. 3.

FIG. 4 illustrates a schematic view of a second conductive layer 31 of the metallization structure 28 which is positioned on the first insulating layer 30 of FIG. 3. The second conductive layer 31 includes a second source redistribution structure 57 that is electrically coupled to the first source redistribution structure 45 and a second drain redistribution structure 58 which is electrically coupled to the first drain redistribution structure 46. The second source redistribution structure 57 and the second drain redistribution structure 58 are arranged laterally and spaced apart from one another and are substantially coplanar.

In some embodiments, the second conductive layer 31 also includes a second gate redistribution structure 62 which is positioned on the first gate redistribution structure 47 and which has a lateral form corresponding to the lateral form of the first gate distribution structure 47. For example, the second gate redistribution structure 62 may include a corresponding gate runner portion 63 and a gate contact portion 64.

The second source redistribution structure 57 is positioned in the first openings 54 of the first insulating layer 30. The second source redistribution structure 57 comprises a plurality of first conductive islands 59 arranged on the first discrete conductive regions 48 of the first redistribution source redistribution structure 45. The lateral extent of each of the first conductive island 59 may be defined by the lateral extent of the first opening 54.

The second drain redistribution structure 58 is arranged in the second openings 55 of the first insulating layer 30 and also extends between the second openings 55 and between the second discrete conductive regions 49. The second drain redistribution structure is also laterally positioned between and laterally spaced apart from the first conductive islands 59 of the second redistribution structure 57. The second drain redistribution structure 58 laterally surrounds the first conductive islands 59 of the second source redistribution structure 57. The second drain redistribution structure 58, therefore, electrically couples the second discrete conductive regions 49 of the underlying first drain redistribution structure 46 to one another since it is positioned in each of the second openings 55 exposing the second conductive regions 49 and extends between the second openings 55 on the upper surface 60 of the first insulating layer 30. The conductive vias 44 positioned between the cell fields 41 within the semiconductor die 20 are now electrically coupled to one another by means of the second drain redistribution structure 58. The drain electrode 24 is electrically coupled by a plurality of vertical electrical connection that are laterally spaced apart to the single conductive layer 58.

The second drain redistribution structure 58 extends laterally over the first source redistribution structure 45 and is electrically insulated from the underlying first source redistribution structure 45 by the intervening first insulating layer 30. In the second conductive layer 31, the source electrodes 23 of the various cell fields 41 are still electrically separate from one another, since the second redistribution structure 57 includes only the first conductive islands 59 positioned above each of the discrete first conductive regions 48 of the underlying first source redistribution structure. The first conductive islands 59 of the second source redistribution structure 57 can be considered to be positioned in windows 61 formed in a continuous second drain redistribution structure 58. The first conductive islands 59 are laterally spaced apart from the side faces of the windows 61. The windows 61 may have a lateral shape which is conformal to the lateral shape of the first conductive islands 59.

In some embodiments, the second drain redistribution structure 58 may have a grid form with one first conductive island 59 positioned in the centre of each opening of the grid.

Figure 5:
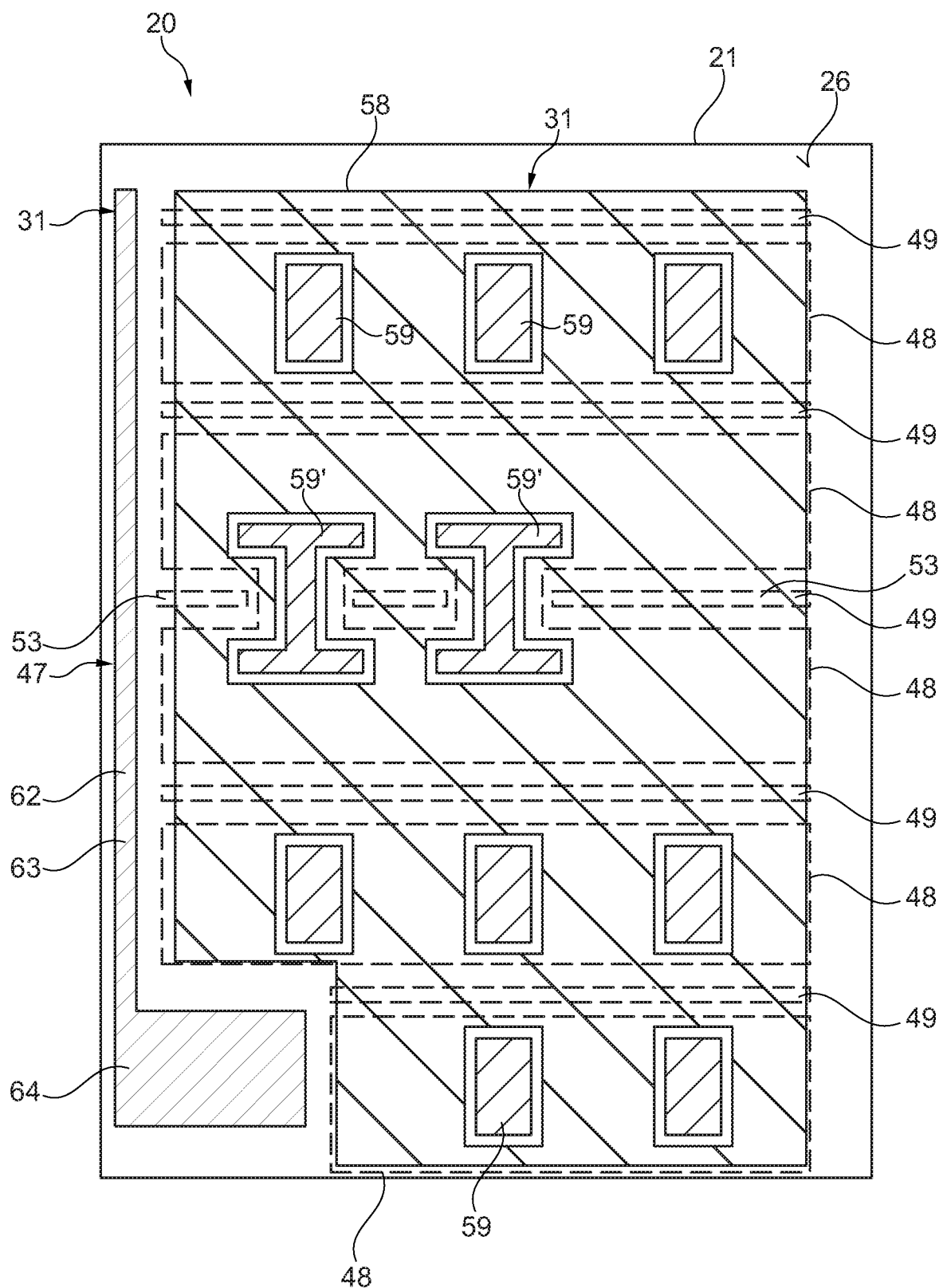
FIG. 5 illustrates a schematic plan view of the second conductive layer and the underlying first conductive layer.

FIG. 5 illustrates a schematic plan view of the second conductive layer 31 shown by the solid lines positioned on the underlying first conductive layer 29 shown in dashed lines. The first insulating layer 30 that is positioned between the first and second conductive layers 29, 31 is not shown in FIG. 5.

From the overlaid plan view of FIG. 5, it can be seen that the second drain redistribution structure 58 extends over and laterally between the second conductive regions 49 including the separate sections 53 of the interrupted second conductive region 49' of the first drain redistribution structure 46 thus electrically coupling the discrete second conductive regions 49 together. The second drain redistribution structure 58 also extends over the first discrete conductive regions 48 of the first source redistribution structure 45, whereby it is electrically insulated from the first discrete conductive regions 48 by the intervening first insulating layer 30. The second drain redistribution structure 58 includes a plurality of windows 61 exposing predefined regions of each of the first discrete conductive regions 48. The first conductive islands 59 forming the second source redistribution structure 57 are positioned within these windows 61 and are laterally spaced apart from the surrounding second drain redistribution structure 58.

In some embodiments, the second conductive layer 31 includes a second gate redistribution structure 62 which is positioned on the first gate redistribution structure 47 and which has a lateral form corresponding to the lateral form of the first gate distribution structure 47. For example, the second gate redistribution structure 62 may include a corresponding gate runner portion 63 and a gate contact portion 64.

Figure 6:
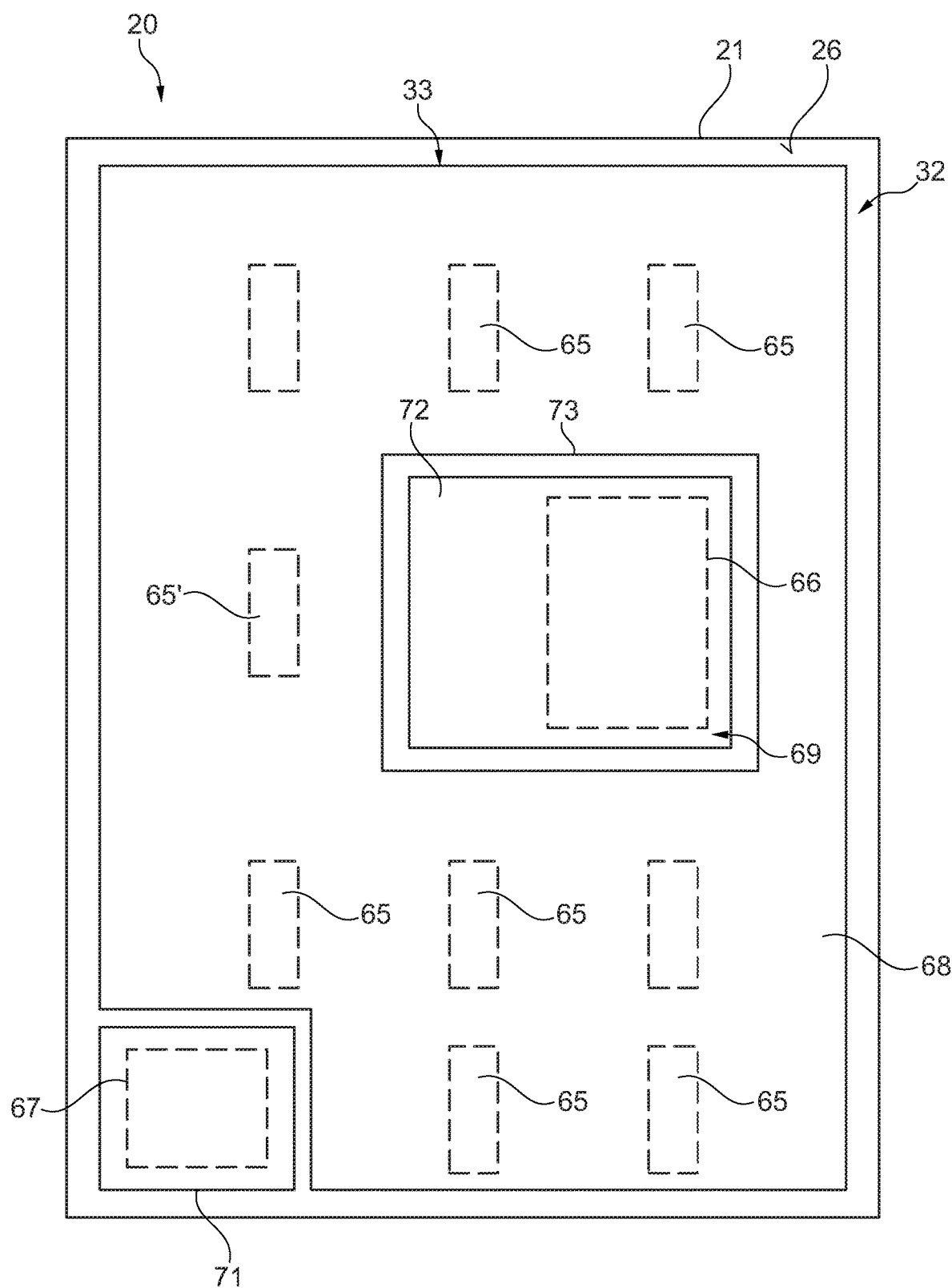
FIG. 6 illustrates a schematic plan view of a third conductive layer positioned on a second insulating layer that is in turn positioned on the second conductive layer of FIG. 4.

FIG. 6 illustrates a schematic plan view of the third conductive layer 33 shown with solid lines that is positioned on the second insulating layer 32 which is indicated with dashed lines.

The second insulating layer 32 is arranged on the second source redistribution structure 57 and on the second drain redistribution structure 58 and is also positioned in the space between them, that is the gap between the first conductive islands 59 and the windows 61 in the second drain redistribution structure 58. The second insulating layer 32 includes third openings 65 which each expose a defined region of the first conductive islands 59 of the second source redistribution structure 57 and one or more fourth openings 66 which each expose a defined region of the second drain redistribution structure 58. The second insulating layer 32 may also include a further opening 67 exposing a predefined portion of the second gate redistribution structure 62 and, in particular, a predefined portion of the gate pad portion 64.

The third openings 65 may be laterally arranged such that one third opening 65 is positioned above each of the first conductive islands 59 and may have a lateral form which substantially corresponds to the lateral form of the first conductive islands 59. The third opening 65' which is positioned above the H-shaped conductive island 59' may, however, have a lateral form which differs from the underlying lateral shape of the first conductive island 59'. For example, the third opening 65' may have a simple rectangular form and be positioned on only one longitudinal bar of the first conductive island 59'.

The third conductive layer 33 comprises a third source redistribution structure 68 that is electrically coupled to the second source redistribution structure 57 and a third drain redistribution structure 69 which is electrically coupled to the second drain redistribution structure 58. The third source redistribution structure 68 is used to electrically couple the first conductive islands 59 of the second redistribution structure 57 to one another. The third source redistribution structure 68 is arranged in the third openings 65 and extends between the first conductive islands 59 and over the second drain redistribution structure 58. In regions in which the third source redistribution structure 68 is positioned on and extends over the second drain redistribution structure 58, it is electrically insulated from the underlying second drain redistribution structure 58 by the intervening second insulating layer 32. The third source redistribution structure 68 may substantially cover the entire first surface 26 of the semiconductor die 21 apart from the regions occupied by the third drain redistribution structure 69 and a gate redistribution structure 70 providing the gate pad 71.

The third drain redistribution structure 69 is arranged in the fourth opening 66 of the second insulating layer 32 and comprises at least one second conductive island 72 that is laterally spaced apart from the third redistribution structure 68. The third source redistribution structure 68 includes a window 73 which laterally surrounds and is spaced apart from the second conductive island 72. In embodiments in which the third drain redistribution structure comprises a plurality of second conductive islands 72, each second conductive island 72 is positioned in a window 73 of the third source redistribution structure 68, the second conductive islands 72 may be laterally spaced apart from one another.

Figure 7:
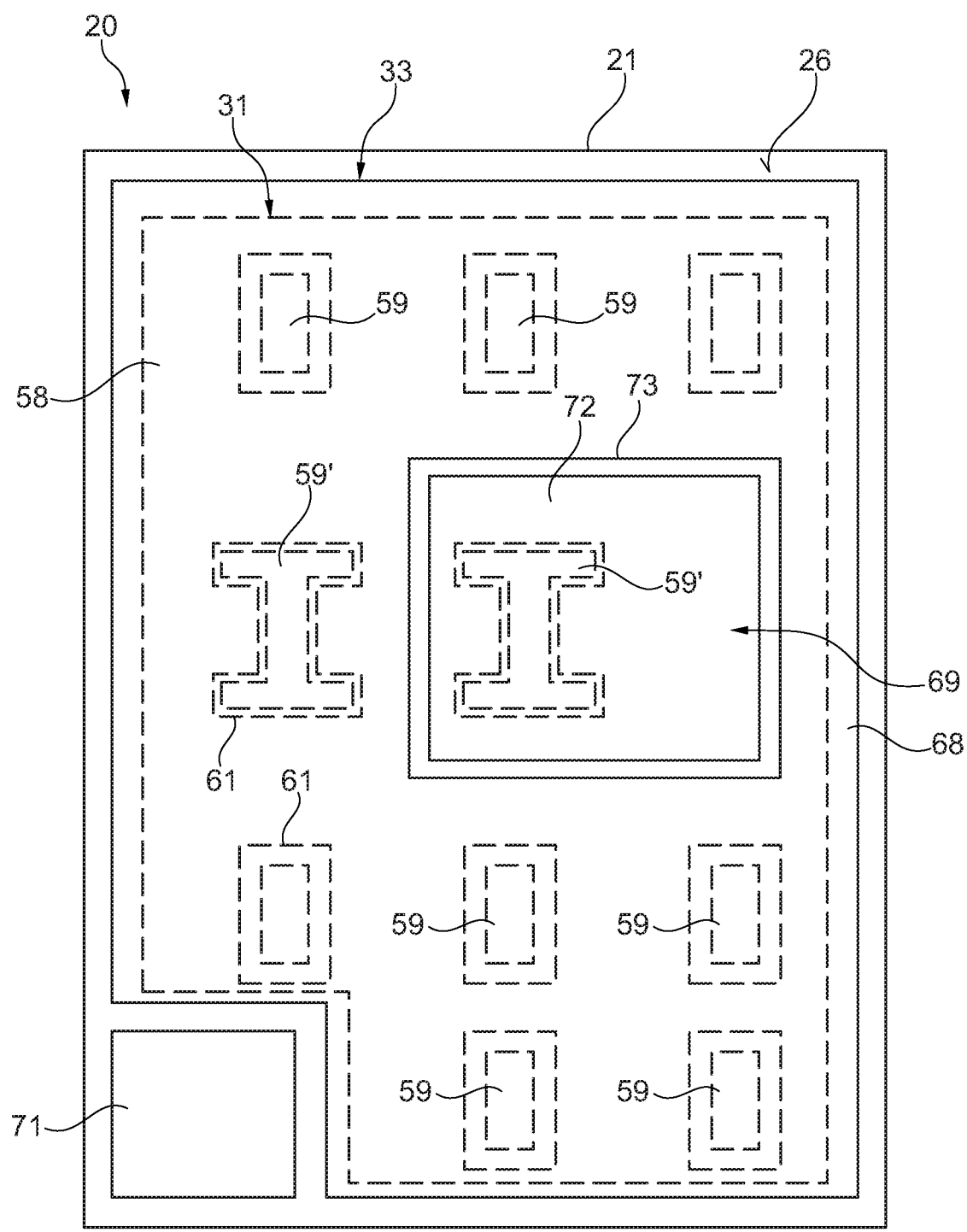
FIG. 7 illustrates a schematic plan view of the third conductive layer of FIG. 6 and the second conductive layer of FIG. 4.

FIG. 7 illustrates a schematic plan view of the third conductive layer 33 of FIG. 6 positioned on the second conductive layer 31 of FIG. 4.

The second conductive island 72 may have a lateral size and shape which is greater than the underlying fourth opening 66 in the second insulating layer 32 and extends over adjoining portions of the underlying second drain redistribution structure 58. In some embodiments, the second conductive island 72 also extends over at least a portion of a first conductive island 59 of the underlying second source redistribution structure 57, for example, a portion of the first conductive island 59'. In these embodiments, the second conductive island 72 is electrically insulated from the underlying first conductive island 59' by an intervening portion of the second insulating layer 32.

For embodiments in which the third conductive layer 33 of the metallization structure 28 provides the contact pads, for example in embodiments in which the metallization structure 28 includes three conductive layers with two intervening insulating layers, the lateral shape, extent and the lateral position of the second conductive islands 72 within the area of the first major surface 26 may substantially correspond to the footprint of the semiconductor device 20.

Figure 8:
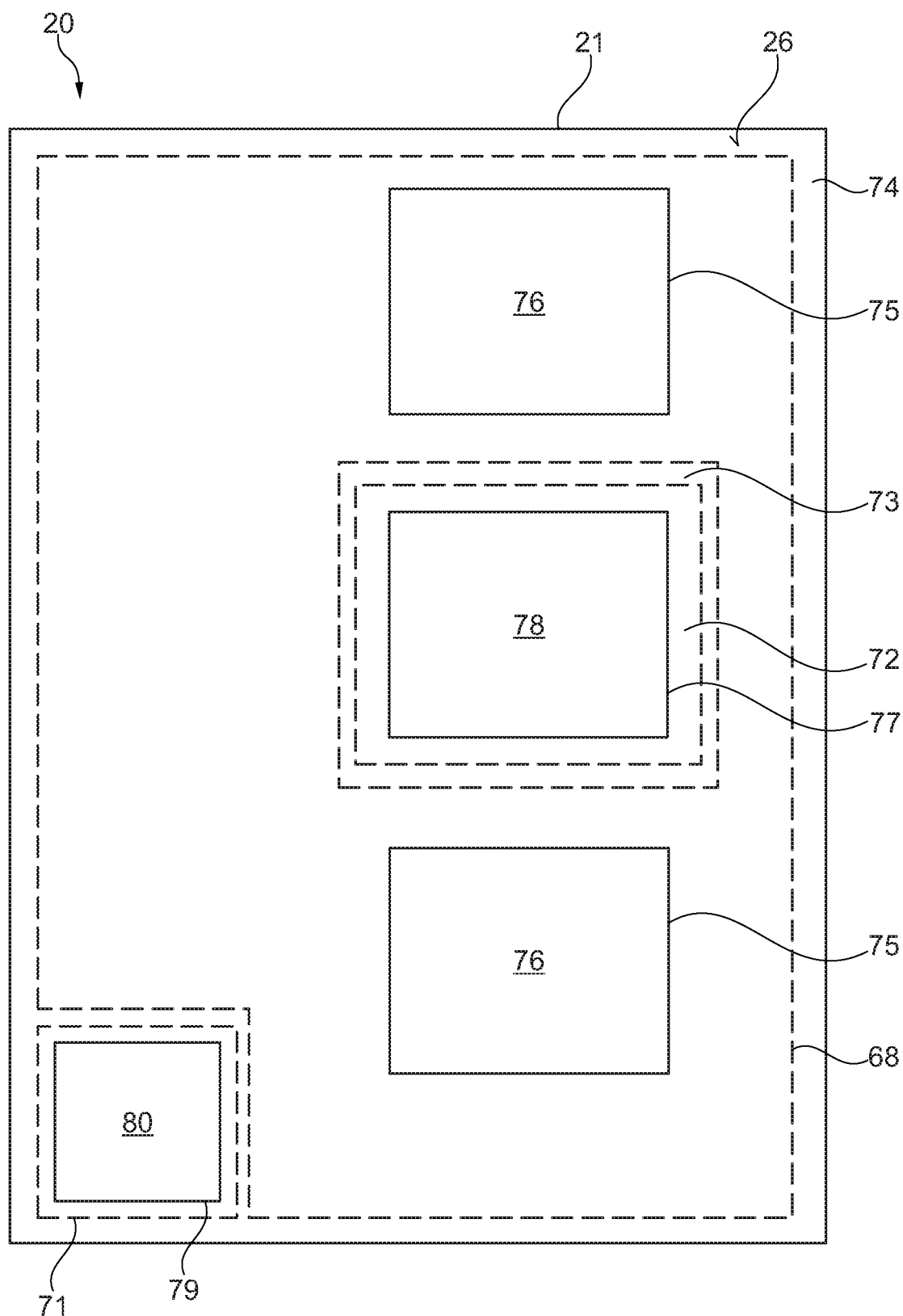
FIG. 8 illustrates a schematic plan view of an epoxy layer positioned on the third conductive layer of FIG. 7.

FIG. 8 illustrates a schematic plan view of an epoxy layer 74 positioned on the third conductive layer 33 of FIG. 7. The epoxy layer 74 is indicated by the solid line and the underlying third conductive layer 33 by a dashed line.

The epoxy layer 74 provides an electrical insulation and passivation of the underlying third conductive layer 33. In some embodiments, the epoxy may be replaced by another suitable material. The epoxy layer 74 may entirely cover the third conductive layer 33 and includes at least one fifth opening 75 which exposes a predefined portion of the third source redistribution structure 68. The exposed portion of the third source redistribution structure 68 provides a source pad 76 for the semiconductor device 20. The epoxy layer 74 further includes at least one sixth opening 77 which exposes at least a portion of the second conductive island 72 of the third drain redistribution structure 69 so that the sixth opening 77 defines the drain pad 78 of the package footprint. The lateral extent of the sixth opening 77 may be slightly smaller than the lateral extent of the second conductive island 72 so that the epoxy layers 74 is positioned on and covers peripheral regions of the second conductive island 72. The epoxy layer 74 further includes a seventh opening 79 which is positioned above the third gate redistribution structure 70 and which defines the gate pad 80.

FIG. 9 illustrates a partially cutaway perspective view of the semiconductor device 20 and illustrates the transistor cells and cell fields 41 of the transistor device 22 and the metallization structure 28.

Figure 10:
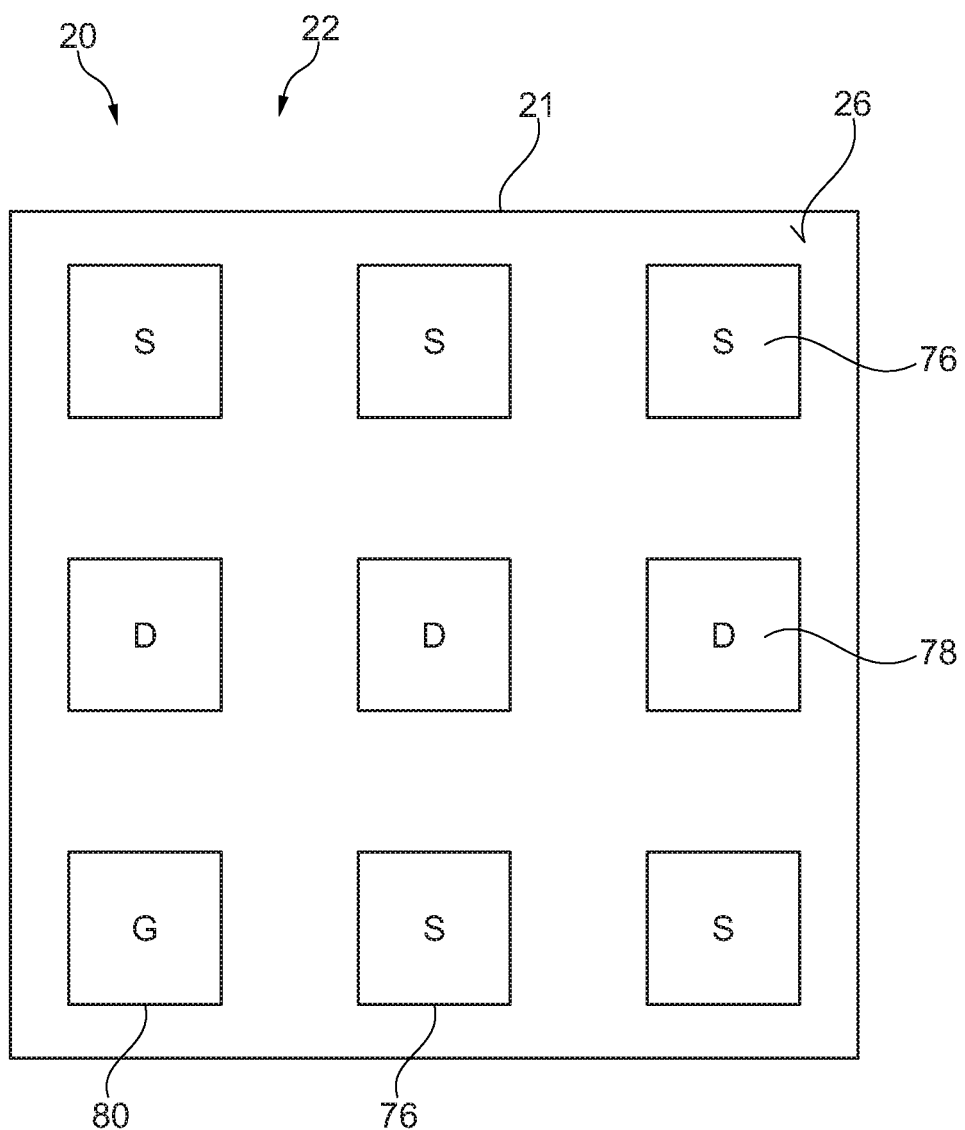
FIG. 10 illustrates a schematic view of a package footprint.

FIG. 10 illustrates a schematic view of a package footprint which may be used for the semiconductor device 20 of FIG. 1. The package footprint includes the pads 34, 35, 36 formed by the outermost conductive layer of the metallization structure 28 formed on the first surface 26 of the semiconductor die.

The outer contact pads of the footprint may be arranged in a regular grid pattern. In some embodiments, such as that illustrated in FIG. 10, the semiconductor device 20 has a package footprint including at least one row of drain contact pads 78 and at least one row of source contact pads 76. The rows of drain pads and source pads may alternate. The gate contact pad 80 may be positioned and align with a row of source contact pads 79. The gate contact pad 80 may be arranged in a corner of the first surface 26 of the semiconductor device 20.

Solder or a metal bump, optionally with a solder coating on the metal bump, or solder balls, may be positioned on each of the contact pads 76, 78, 80.

A chip scale semiconductor device including a vertical transistor device and metallization structure is provided in which the vertical conductive redistribution structure from the drain region to the first surface is provided by at least one conductive via within the semiconductor die and a drain redistribution structure comprising three or more conductive layers arranged on the first surface. The opposing second surface may be electrically inactive and not form part of the drain region as it does not need to be contacted for the drain redistribution structure. This enables the thickness of the semiconductor die to be variable and also the second surface to be more readily used for other purposes, since it is electrically inactive. For example, the second surface may be used as a contact surface for a heat sink, or for product marking, for example by laser shots into the second surface.

The plurality of conductive vias within the semiconductor die that are electrically coupled to the drain electrode are laterally spaced apart from one another. The lateral electrical connection between the conductive vias is provided in a conductive layer of the metallization structure that is vertically spaced apart from the lowermost conductive layer of the metallization structure.

The lateral electrical connection between the laterally spaced apart source electrodes is provided in a conductive layer of the metallization structure that is vertically spaced apart from the lowermost conductive layer of the metallization structure and that is different from and vertically spaced apart from the conductive layer of the metallization structure used to connect the conductive vias. In some embodiments, the outermost conductive layer of the metallization structure is used to electrically connect the source electrodes.

This arrangement of stacking the laterally connections between the two power electrodes above one another and on a major surface of the semiconductor die avoids the need for a separate packaging process and enables the footprint of the device and die size to be nearly the same, thus providing a chip sized package that can be fabricated at the wafer level.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor die comprising a vertical transistor device having a source electrode, a drain electrode and a gate electrode, the semiconductor die having a first surface;
a metallization structure comprising a first conductive layer above the first surface, a first insulating layer above the first conductive layer, a second conductive layer above the first insulating layer, a second insulating layer above the second conductive layer and a third conductive layer above the second insluting layer,
wherein the third conductive layer comprises at least one source pad electrically coupled to the source electrode, at least one drain pad electrically coupled to the drain electrode and at least one gate pad electrically coupled to the gate electrode.

2. The semiconductor device of claim 1, wherein the first conductive layer comprises a first source redistribution structure electrically coupled to the source electrode, a first drain redistribution structure electrically coupled to the drain electrode and a first gate redistribution structure electrically coupled to the gate electrode, wherein the first source redistribution structure comprises a plurality of discrete first conductive regions, and wherein the first drain redistribution structure comprises a plurality of discrete second conductive regions that are laterally positioned between and laterally spaced apart from the first discrete conductive regions of the first source redistribution structure.

3. The semiconductor device of claim 2, wherein the plurality of discrete second conductive regions of the first drain redistribution structure are electrically coupled together by the second conductive layer, and wherein the plurality of discrete first conductive regions of the first source redistribution structure are electrically coupled together by the third redistribution structure.

4. The semiconductor device of claim 2, wherein the discrete second conductive regions of the first drain redistribution structure have a strip form.

5. The semiconductor device of claim 2, further comprising:
one or more conductive vias extending into the semiconductor die from the first surface,
wherein the one or more conductive vias are electrically coupled to a doped drain region positioned within the semiconductor die and to the first drain redistribution structure above the first surface of the semiconductor die.

6. The semiconductor device of claim 5, wherein the vertical transistor device comprises an active area that is divided into a plurality of cell fields, and wherein two elongate conductive vias extending substantially parallel to one another are positioned between adjacent cell fields and are electrically coupled to a common one of the second discrete conductive regions of the first drain distribution structure.

7. The semiconductor device of claim 2, wherein the first insulating layer is arranged laterally between the first source redistribution structure and the first drain redistribution structure, wherein the first insulating layer comprises:
first openings exposing defined portions of the first discrete conductive regions of the first source redistribution structure; and
second openings exposing defined portions of the second discrete conductive regions of the first drain redistribution structure.

8. The semiconductor device of claim 7, wherein the second conductive layer comprises a second source redistribution structure that is electrically coupled to the first source redistribution structure and a second drain redistribution structure that is electrically coupled to the first drain redistribution structure, wherein the second source redistribution structure is arranged in the first openings of the first insulation layer and comprises a plurality of first conductive islands that are arranged above the first conductive regions of the first source redistribution structure, and wherein the second drain redistribution structure is arranged in the second openings of the first insulation layer and is laterally positioned between and laterally spaced apart from the first conductive islands of the second source redistribution structure, wherein the second drain redistribution structure laterally surrounds the first conductive islands of the second source redistribution structure.

9. The semiconductor device of claim 8, wherein the second drain redistribution structure electrically couples the second conductive regions of the first drain redistribution structure to one another.

10. The semiconductor device of claim 8, wherein the second drain redistribution structure is arranged vertically above the first drain redistribution structure and vertically above portions of the first source redistribution structure that are covered by the first insulation layer.

11. The semiconductor device of claim 10, wherein the second insulating layer is arranged above the second source redistribution structure and above the second drain redistribution structure and has third openings exposing defined regions of the first conductive islands of the second source redistribution structure and at least one fourth opening exposing a defined region of the second drain redistribution structure.

12. The semiconductor device of claim 11, wherein the third conductive layer comprises a third source redistribution structure that is electrically coupled to the second source redistribution structure and a third drain redistribution structure that is electrically coupled to the second drain redistribution structure, wherein the third source redistribution structure is arranged in the third openings and electrically couples the first conductive islands of the second source redistribution structure to one another, wherein the third source redistribution structure extends over portions of the second drain redistribution structure that are covered by the second insulation layer, and wherein the third drain redistribution structure is arranged in the fourth openings and comprises at least one second conductive island that is laterally spaced apart from the third source redistribution structure.

13. The semiconductor device of claim 12, wherein the second conductive islands of the third drain redistribution structure each have a lateral size such that each extends over portions of the second source redistribution structure that are covered by the second insulation layer.

14. The semiconductor device of claim 11, wherein the conductive vias, the first drain redistribution structure, the first source redistribution structure and the first gate redistribution structure comprise tungsten, wherein the first insulating layer comprises a polyimide, wherein the second drain redistribution structure and the second source redistribution structure are formed of an AlCu alloy, wherein the second insulating layer comprises a polyimide, wherein the third drain redistribution structure and the third source redistribution structure are formed of Cu.

15. The semiconductor device of claim 1, further comprising:
an epoxy layer arranged above the third conductive layer, wherein the epoxy layer comprises:
at least one fifth opening that exposes a portion of the third source redistribution layer and defines the source pad;
at least one sixth opening that exposes a portion of the second conductive island of the third drain redistribution structure and defines the drain pad; and
at least one seventh opening that defines the gate pad.

16. The semiconductor device of claim 1, wherein the drain electrode comprises a doped drain region of the semiconductor die.

17. The semiconductor device of claim 16, wherein the doped drain region is positioned at a second surface of the semiconductor die which opposes the first surface.

18. The semiconductor device of claim 16, wherein the semiconductor die has a second surface which opposes the first surface, and wherein the doped drain region is positioned within the semiconductor die and spaced apart from the second surface.

19. The semiconductor device of claim 1, further comprising a third insulating layer over a second surface of the semiconductor die which opposes the first surface.

20. The semiconductor device of claim 19, wherein the third insulating layer is an epoxy layer or an epoxy foil.

* * * * *

UNITED STATES PATENT AND TRADEMARK OFFICE
CERTIFICATE OF CORRECTION

| | |
|---|---|
| PATENT NO. | : 11,876,041 B2 |
| APPLICATION NO. | : 17/556247 |
| DATED | : January 16, 2024 |
| INVENTOR(S) | : O. Blank et al. |

It is certified that error appears in the above-identified patent and that said Letters Patent is hereby corrected as shown below:

On the Title Page

Page 2/U.S. Pat. Docs. (Line 5), please change "Domori" to -- Oomori --.

Signed and Sealed this
Nineteenth Day of March, 2024

Katherine Kelly Vidal
*Director of the United States Patent and Trademark Office*